(12) United States Patent
Kim et al.

(10) Patent No.: US 7,932,522 B2
(45) Date of Patent: Apr. 26, 2011

(54) THIN FILM TRANSISTOR ARRAY PANEL AND METHOD FOR MANUFACTURING THE SAME

(75) Inventors: Jang-Soo Kim, Yongin-si (KR);
Jae-Hyoung Youn, Seoul (KR);
Su-Hyoung Kang, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 12/254,440

(22) Filed: Oct. 20, 2008

(65) Prior Publication Data

US 2009/0256155 A1 Oct. 15, 2009

(30) Foreign Application Priority Data

Apr. 15, 2008 (KR) .................. 10-2008-0034876

(51) Int. Cl.
*H01L 33/00* (2010.01)
(52) U.S. Cl. ............... 257/72; 257/59; 257/E33.053
(58) Field of Classification Search ............ 257/59, 257/72, E33.053; 349/43, 44
See application file for complete search history.

(56) References Cited

U.S. PATENT DOCUMENTS

2004/0001170 A1* 1/2004 Chang et al. ............. 349/106
2004/0125277 A1 7/2004 Kim

FOREIGN PATENT DOCUMENTS

| JP | 09-292633 | 11/1997 |
|---|---|---|
| JP | 10-325964 | 12/1998 |
| JP | 11-052419 | 2/1999 |
| JP | 2002-319321 | 10/2002 |
| KR | 10-1999-0050745 | 7/1999 |
| KR | 10-2004-0001695 | 1/2004 |
| KR | 10-2004-0085792 | 10/2004 |
| KR | 10-2007-0033070 | 3/2007 |
| KR | 10-2007-0033072 | 3/2007 |
| KR | 10-2007-0082090 | 8/2007 |

* cited by examiner

*Primary Examiner* — Evan Pert
*Assistant Examiner* — Selim Ahmed
(74) *Attorney, Agent, or Firm* — H.C. Park & Associates, PLC

(57) ABSTRACT

A thin film transistor panel includes a substrate, a gate line extending in a first direction on the substrate, a data line disposed on the substrate, the data line crossing the gate line with an insulation layer therebetween and extending in a second direction, a thin film transistor including a control terminal connected to the gate line, an input terminal connected to the data line, and an output terminal, a color filter disposed on the thin film transistor, the color filter having an opening corresponding to the output terminal of the thin film transistor, a light blocking member disposed in the opening of the color filter, the light blocking member exposing a first region of a first end portion of the output terminal of the thin film transistor and having an output terminal light blocking portion enclosing the circumference of the first region, and a pixel electrode disposed on the light blocking member and the color filter, the pixel electrode contacting the first region of the output terminal.

12 Claims, 8 Drawing Sheets

THIN FILM TRANSISTOR ARRAY PANEL AND METHOD FOR MANUFACTURING THE SAME

CROSS-REFERENCE TO RELATED APPLICATION

This application claims priority from and the benefit of Korean Patent Application No. 10-2008-0034876, filed on Apr. 15, 2008, which is hereby incorporated by reference for all purposes as if fully set forth herein.

BACKGROUND OF THE INVENTION

1. Field of the Invention

The present invention relates to a thin film transistor array panel and a manufacturing method thereof.

2. Discussion of the Background

Liquid crystal displays (LCDs) are one of the most widely used flat panel displays, and an LCD includes a pair of panels provided with field-generating electrodes, such as pixel electrodes and a common electrode, and a liquid crystal (LC) layer disposed between the two panels. The LCD displays images when voltages are applied to the field-generating electrodes to generate an electric field in the LC layer that determines the orientations of LC molecules therein to adjust polarization of incident light.

This liquid crystal display also includes a color filter to display colors using light transmitted to the liquid crystal layer, and the color filter is generally disposed on a display panel having a common electrode. Since the color filter commonly includes red, green, and blue colors, the color filter should be aligned to face the corresponding pixels when aligning the two display panels. However, because the area of the light blocking member defining the openings corresponding to the pixels may be wide in consideration of a misalignment margin, the size of the openings may be decreased such that the aperture ratio of the pixels may be reduced.

To solve this problem, techniques in which the color filters are formed on the display panel having thin film transistors have been provided. When the color filter is formed on the thin film transistor array panel, a portion of the color filter should be removed to form a contact hole through which the pixel electrode may be connected to a drain electrode of the thin film transistor, and the side wall of the color filter may be formed with a smooth incline. However, the arrangement of the LC molecules may be abnormally distorted by the inclined portion, thereby generating light leakage. To block the light leakage, the drain electrode may be formed to be wide, but this may deteriorate the aperture ratio.

SUMMARY OF THE INVENTION

The present invention provides a thin film transistor array panel that may provide for an improved aperture ratio.

The present invention also provides a method of manufacturing the thin film transistor.

Additional features of the invention will be set forth in the description which follows, and in part will be apparent from the description, or may be learned by practice of the invention.

The present invention also discloses a thin film transistor panel including a substrate, a gate line extending in a first direction on the substrate, a data line disposed on the substrate, the data line crossing and insulated from the gate line and extending in a second direction, a thin film transistor, which includes a control terminal connected to the gate line, an input terminal connected to the data line, and an output terminal, a color filter disposed on the thin film transistor, the color filter having an opening corresponding to the output terminal of the thin film transistor, a light blocking member disposed in the opening of the color filter, the light blocking member exposing a first region of a first end portion of the output terminal of the thin film transistor and having an output terminal light blocking portion enclosing the first region, and a pixel electrode disposed on the light blocking member and the color filter, the pixel electrode contacting the first region of the output terminal.

The present invention also discloses a method for manufacturing a thin film transistor array panel including forming a gate line extending in a first direction, forming a gate insulating layer on the gate line, forming a semiconductor on the gate insulating layer, forming a data line, which extends in a second direction crossing the first direction, and a drain electrode, forming a passivation layer on the data line and the drain electrode, forming a color filter on the passivation layer, the color filter having an opening exposing a first end portion of the drain electrode, forming a drain electrode light blocking member exposing a first region of the first end portion of the drain electrode and enclosing a circumference of the first region in the opening of the color filter, forming an overcoat on the color filter and the drain electrode light blocking member, forming a contact hole exposing the first region of the drain electrode by photolithography of the overcoat and the passivation layer, and forming a pixel electrode connected to the drain electrode through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention

DETAILED DESCRIPTION OF THE ILLUSTRATED EMBODIMENTS

Figure 1:
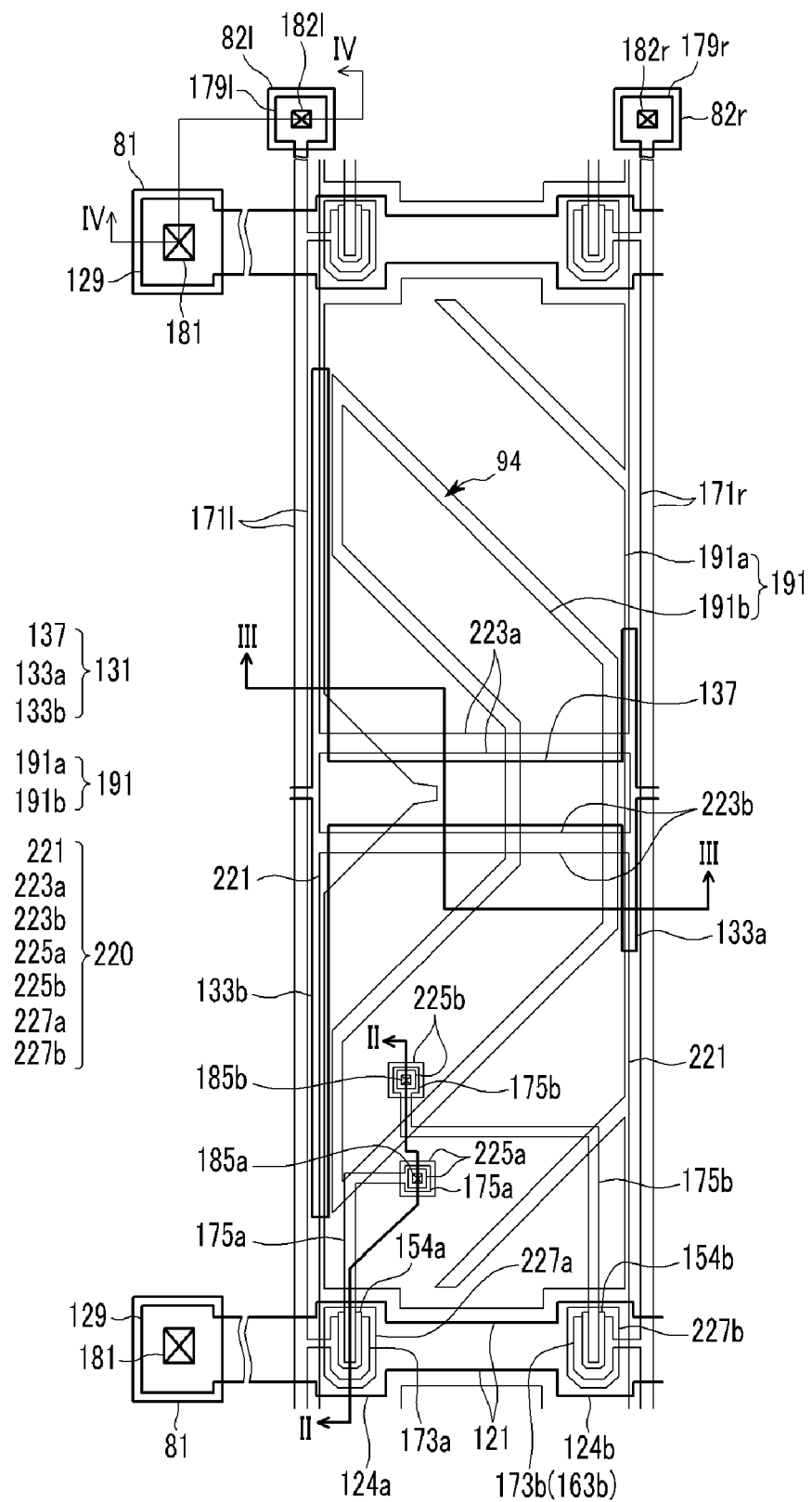
FIG. 1 is a layout view of a thin film transistor array panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
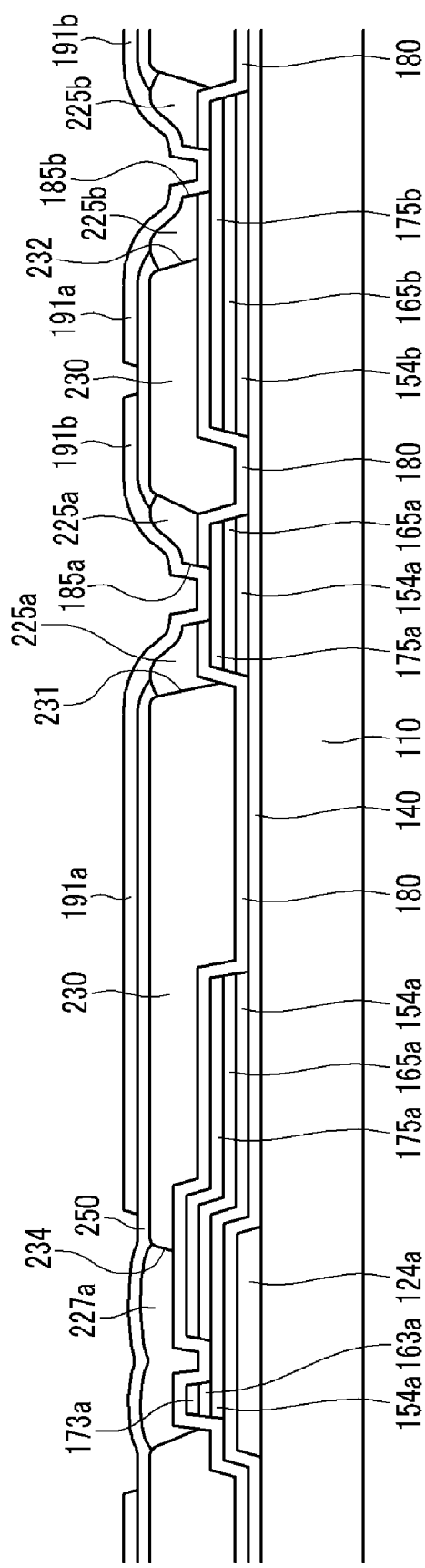
FIG. 2 is a cross-sectional view taken along line II-II of FIG. 1.
Figure 3:
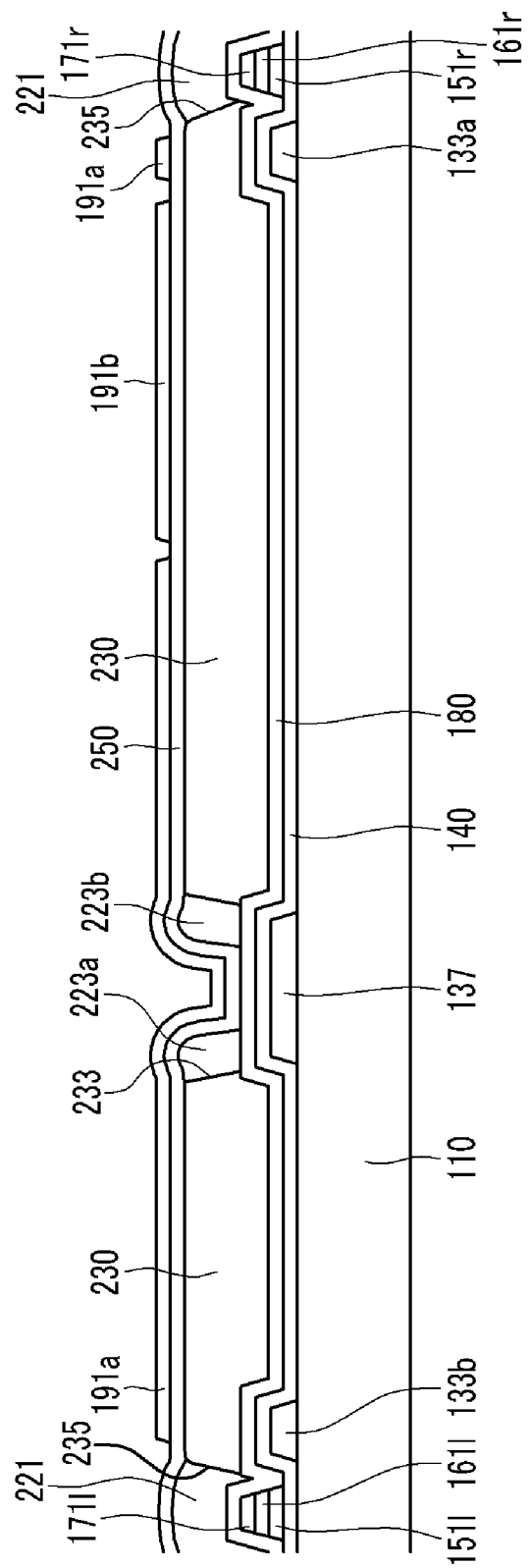
FIG. 3 is a cross-sectional view taken along line III-III of FIG. 1.
Figure 4:
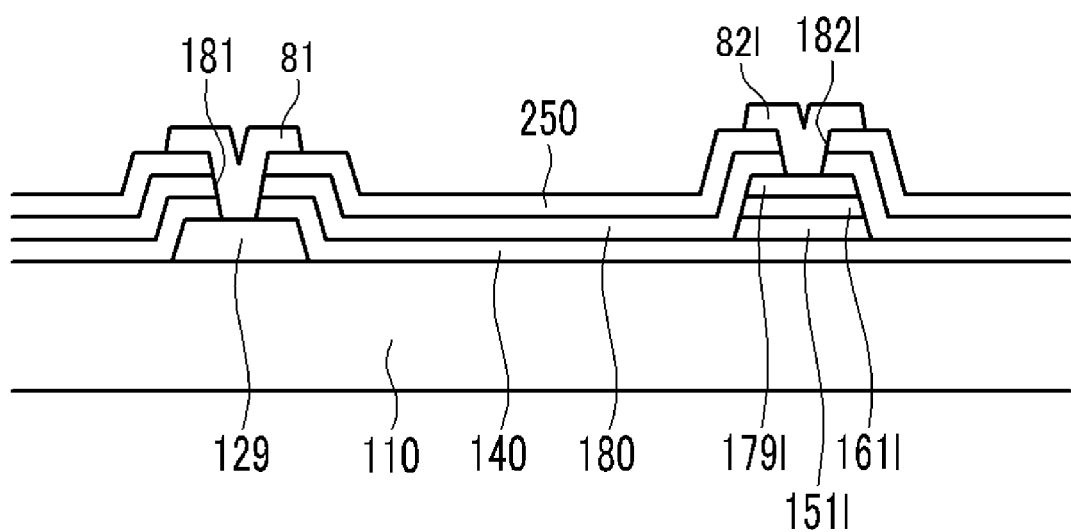
FIG. 4 is a cross-sectional view taken along line IV-IV of FIG. 1.

Now, a thin film transistor array panel according to an exemplary embodiment of the present invention will be described in detail. FIG. 1 is a layout view of a thin film transistor array panel according to a first exemplary embodiment of the present invention, and FIG. 2, FIG. 3, and FIG. 4 are cross-sectional views taken along lines II-II, III-III, and IV-IV of FIG. 1, respectively.

In a thin film transistor array panel according to an exemplary embodiment of the present invention, a plurality of gate lines 121 and a plurality of storage electrode lines 131 are formed on an insulation substrate 110, which may be made of transparent glass.

The gate lines 121 transmit gate signals and extend substantially in a transverse direction. Each gate line 121 includes a plurality of protrusions forming gate electrodes 124a and 124b, and an end portion 129 having a large area for connection with another layer or an external driving circuit. The storage electrode lines 131 are disposed between two adjacent gate lines 121 and extend substantially parallel to the gate lines 121 in the transverse direction, and receive a voltage such as a common voltage Vcom that is applied to a common electrode. The storage electrode line 131 includes a plurality of protrusions forming a plurality of storage electrodes 137, and a plurality of branches 133a and 133b to prevent light leakage and increase the area of the storage line 131.

The gate lines 121 and the storage electrode lines 131 may have a multi-layered structure including two conductive layers (not shown) having different physical properties. One of the two conductive layers may be made of a low resistivity metal, such as an Al-containing metal, a Ag-containing metal, or a Cu-containing metal, to reduce signal delay or voltage drop in the gate lines 121 and the storage electrode lines 131. The other conductive layer may be made of a material, such as a Mo-containing metal, Cr, Ti, or Ta, that has good contact characteristics with other materials such as indium tin oxide (ITO) and indium zinc oxide (IZO). As examples of these combinations, a chromium lower layer and an aluminum or aluminum alloy upper layer, and an aluminum or aluminum alloy lower layer and a molybdenum or a molybdenum alloy upper layer, may be formed. However, the gate lines 121 and the storage electrode lines 131 may be made of various other metals or electrical conductors.

Side surfaces of the gate lines 121 and the storage electrode lines 131 are inclined to a surface of the substrate 110, and an inclination angle thereof may be about 30° to 80°.

A gate insulating layer 140, which may be made of silicon nitride ($SiN_x$) or silicon oxide ($SiO_x$), is formed on the gate lines 121 and the storage electrode lines 131.

A plurality of semiconductor stripes 151l and 151r, which may be made of hydrogenated amorphous silicon (a-Si) or polysilicon, are formed in pairs on the gate insulating layer 140. The semiconductor stripes 151l and 151r substantially extend in a vertical direction, and include a plurality of protrusions 154a and 154b respectively extending toward the gate electrodes 124a and 124b.

A plurality of ohmic contact stripes 161l and 161r and islands 165a and 165b are formed on the semiconductor stripes 151l and 151r. The ohmic contact stripes 161l and 161r and islands 165a and 165b may be made of a material such as n+hydrogenated amorphous silicon in which an n-type impurity such as phosphorus is doped with a high concentration, or silicide. The ohmic contact stripes 161l and 161r respectively include a plurality of protrusions 163a and 163b, and the protrusions 163a and 163b and the ohmic contact islands 165a and 165b are formed in pairs and are disposed on the protrusions 154a and 154b of the semiconductor stripes 151l and 151r, respectively.

The semiconductors 151l and 151r and the ohmic contacts 161l, 161r, 165a, and 165b are inclined with respect to a surface of the substrate 110, and an inclination angle thereof is about 30° to 80°.

A plurality of left and right data lines 171l and 171r and a plurality of first and second drain electrodes 175a and 175b are formed on the ohmic contacts 161l, 161r, 165a, and 165b. Here, the ohmic contact stripes 161l and 161r, and the semiconductor stripes 151l and 151r, are disposed under the left data lines 171l and the right data lines 171r, respectively.

The data lines 171l and 171r transmit data voltages, and extend substantially in a vertical direction while crossing the gate lines 121 and the storage electrode lines 131. Each data line 171l and 171r includes a plurality of source electrodes 173a and 173b curved toward the gate electrodes 124a and 124b and having a "U" shape, and end portions 179l and 179r to connect to other layers or an external driving circuit.

The drain electrodes 175a and 175b are respectively spaced apart from the data lines 171l and 171r, and face the source electrode 173a and 173b with respect to the gate electrodes 124a and 124b. Each drain electrode 175a and 175b includes a first end portion connected to respective sub-pixel electrodes 191a and 191b and having a wide area, and a second end portion having a bar shape. The second end portions of the drain electrodes 175a and 175b are enclosed by the source electrodes 173a and 173b with the "U" shape, respectively.

The gate electrodes 124a and 124b, the source electrodes 173a and 173b, and the drain electrodes 175a and 175b respectively form thin film transistors Qa and Qb along with the semiconductors 154a and 154b, and the channels of the thin film transistors Qa and Qb are formed in the semiconductors 154a and 154b between the source electrodes 173a and 173b, and the drain electrodes 175a and 175b.

The data lines 171l and 171r and the drain electrodes 175a and 175b may have a multi-layered structure including a refractory metal layer (not shown) and a low resistance conductive layer (not shown)

A multi-layered structure may include, for example, a dual-layer including a lower layer of chromium, molybdenum, or an alloy thereof and an aluminum or aluminum alloy upper layer, or a triple-layer including a molybdenum or molybdenum alloy lower layer, an aluminum or aluminum alloy middle layer, and a molybdenum or molybdenum alloy upper layer. However, the data lines 171l and 171r and the drain electrodes 175a and 175b may be made of various other metals or conductors.

Side surfaces of the data lines 171l and 171r and the drain electrodes 175a and 175b may be inclined to the surface of the substrate 110 like the gate lines 121 and the storage electrode lines 131, and the inclination angle thereof may be about 30° to 80°.

A passivation layer 180 is formed on the data lines 171*l* and 171*r* and the drain electrodes 175*a* and 175*b*. The passivation layer 180 may be made of silicon nitride or silicon oxide.

A plurality of color filters 230 are formed on the passivation layer 180. The color filters 230 may each have one color of red, green, and blue. The color filters 230 may be formed with the same color in the longitudinal direction between two data lines 171*l* and 171*r*, and the color filters 230 have a striped arrangement of the sequence of green, red, and blue in this case. Here, the height of the color filters 230 may be in the range of about 1-3 μm. However, the arrangement of the color filters 230 may be changed in various ways to arrange the different colors in each pixel.

The color filters 230 have a plurality of openings 231 and 232 exposing the wide end portions of the drain electrodes 175*a* and 175*b*, a plurality of openings 233 exposing the storage electrodes 137, a plurality of openings 234 exposing the portion near the channels of the thin film transistors, and a plurality of openings 235 exposing the right and left data lines 171*l* and 171*r*. Here, the openings 233 exposing the storage electrodes 137 reduce the distance between the storage electrodes 137 and the pixel electrodes 190, and although the area of the storage electrodes 137 is decreased, the storage capacitance generated therebetween may be sufficiently obtained. The openings 233 may be omitted if necessary.

Figure 5:
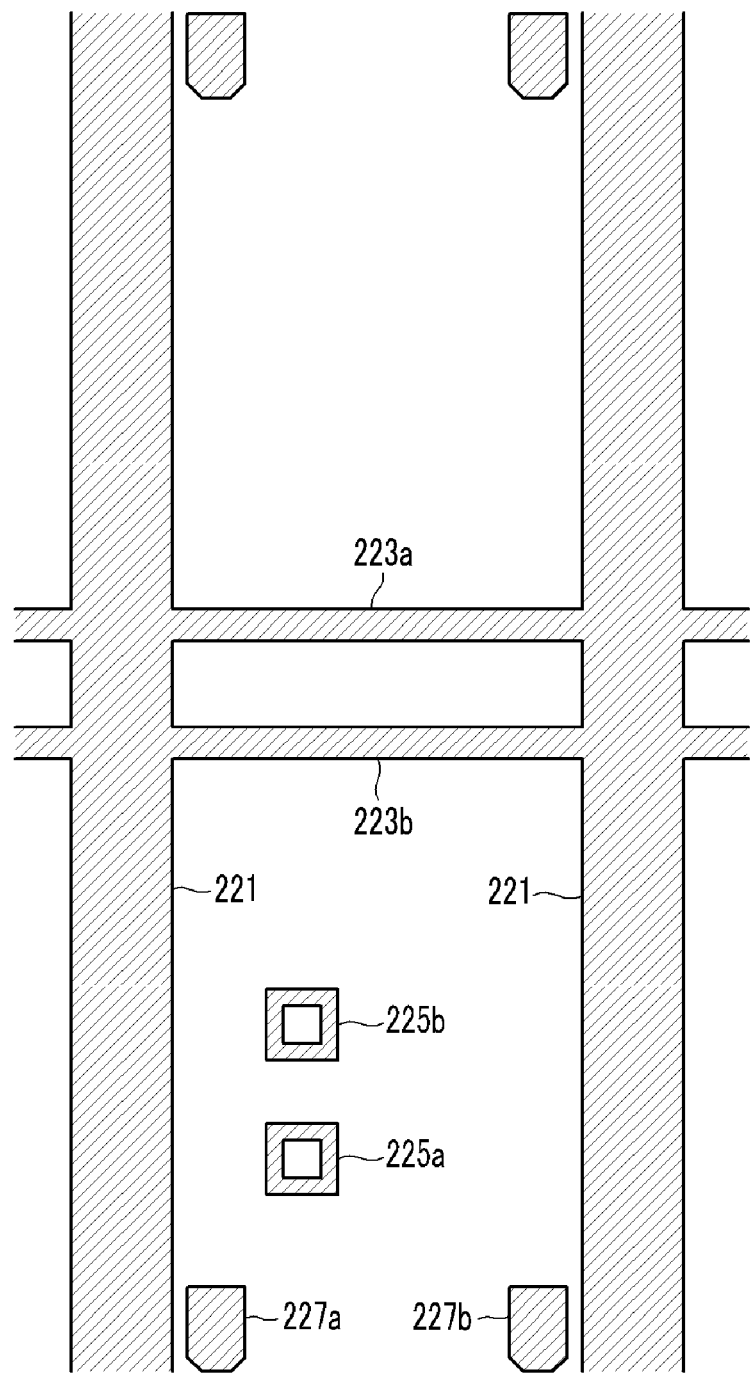
FIG. 5 is a layout view only showing a light blocking member in the thin film transistor array panel shown in FIG. 1.

A light blocking member 220 is formed on the passivation layer 180. The light blocking member 220 is disposed in the openings 231, 232, 233, 234, and 235 of the color filters 230. Accordingly, as shown in FIG. 5, the light blocking member 220 includes first portions 221 disposed on the data lines 171*l* and 171*r* in the longitudinal direction, second portions 223*a* and 223*b* disposed above and below the storage electrode lines 131, third portions 225*a* and 225*b* disposed near expanded end portions of the drain electrodes 175*a* and 175*b*, and fourth portions 227*a* and 227*b* covering the channels of the thin film transistors Qa and Qb.

The first portions 221 cover the data lines 171*l* and 171*r*, and extend according to the data lines 171*l* and 171*r* in the longitudinal direction. Specifically, the first portions 221 are disposed with a stripe shape to define the space between the color filters 230 of the different colors. The second portions 223*a* and 223*b* are disposed above and below the storage electrodes 137, and are formed parallel to the storage electrodes 137 in the transverse direction such that they are connected between the first portions 221. The third portions 225*a* and 225*b* are disposed on the end portions of the drain electrodes 175*a* and 175*b*, and have a shape enclosing the end portions of the drain electrodes 175*a* and 175*b*, when shown on a plane surface. The shapes of the third portions 225*a* and 225*b* may vary, and for example, may be a quadrangle shape as shown in FIG. 1, an octagonal shape, or a circular shape.

In this way, because the first portions 221 extend in the longitudinal direction, the light leakage generated near the data lines 171*l* and 171*r* may be blocked. Also, the second portions 223*a* and 223*b* are disposed adjacent to the storage electrodes 137. Thus, the area where the liquid crystal cell gap becomes non-uniform due to the opening 233 of the color filter 230 exposing the storage electrode 137 may be decreased, and the light blocking member blocks the light leakage generated near the storage electrode such that the area of the storage electrode may be reduced, which may improve the aperture ratio. Also, the third portions 225*a* and 225*b* are formed on a portion where contact holes 185*a* and 185*b*, through which the drain electrodes 175*a* and 175*b* are connected to pixel electrodes, are disposed such that the area where the liquid crystal cell gap becomes non-uniform near the contact holes may be reduced, and the light blocking member blocks the light leakage generated near the contact holes such that the area of the drain electrode may be reduced, which may improve the aperture ratio.

The light blocking member 220 further includes the fourth portions 227*a* and 227*b* disposed on the thin film transistors Qa and Qb. The fourth portions 227*a* and 227*b* prevent light from being incident to the channels of the thin film transistors Qa and Qb. In the FIGs., the fourth portions 227*a* and 227*b* are spaced apart from the first portions 221 and have an island shape, but they may be connected to the first portions 221.

Here, the height of the light blocking member 220 may be almost the same as that of the color filters 230, however if the height of the light blocking member 220 is less than 1.5 μm, the ability of the light blocking member 220 to prevent the light transmission may be deteriorated. Accordingly, the height of the light blocking member 220 should be more than 1.5 μm. The width of the light blocking member 220 may vary, however if the width of the light blocking member 220 is very narrow, light leakage may occur, and if the width thereof is very wide, the aperture ratio may be deteriorated. Therefore, an appropriate width is required. The width of the light blocking member 220, particularly the width of the third portions 225*a* and 225*b*, will be described below in detail with reference to FIG. 6.

An overcoat 250 is formed on the light blocking member 220 and the color filters 230. The overcoat 250 is formed on the passivation layer 180 covering the storage electrodes 137 between the second portions 223*a* and 223*b*. The overcoat 250 is removed on the third portions 225*a* and 225*b* of the light blocking member 220, thereby exposing the third portions 225*a* and 225*b*. Accordingly, contact between the overcoat 250 and the passivation layer 180 in the active region is prevented. When the overcoat 250 and the passivation layer 180 contact each other, the overcoat 250 may be lifted due to adhesion stress between the two layers, and preventing this may improve the process yield. The overcoat 250 may be made of an inorganic insulating material such as silicon oxide, silicon nitride, or an organic insulating material.

The overcoat 250 and the passivation layer 180 have a plurality of contact holes 182*l*, 182*r* exposing the end portions 179*l* and 179*r* of the data lines 171*l* and 171*r*, respectively, and the passivation layer 180 has a plurality of contact holes 185*a* and 185*b* exposing the end portions of the drain electrodes 175*a* and 175*b*. Also, the overcoat 250, the passivation layer 180, and the gate insulating layer 140 have a plurality of contact holes 181 exposing the end portions 129 of the gate lines 121. The contact holes 185*a* and 185*b* are disposed inside the third portions 225*a* and 225*b*, and are formed by simultaneously etching the overcoat 250 and the passivation layer 180.

A plurality of first and second sub-pixel electrodes 191*a* and 191*b* and a plurality of contact assistants 81, 82*l*, and 82*r* are formed on the overcoat 250. They may be made of a transparent conductive material such as ITO or IZO.

The first sub-pixel electrode 191*a* and the second sub-pixel electrode 191*b* are connected to the drain electrodes 175*a* and 175*b* through the contact holes 185*a* and 185*b*, respectively, and the data voltage is applied from the drain electrodes 175*a* and 175*b* to the first and second pixel electrodes 191*a* and 191*b*.

Two sub-pixel electrodes 191*a* and 191*b* applied with the data voltages generate an electric field along with the common electrode to determine the orientation of liquid crystal molecules of the liquid crystal layer disposed between the electrodes 191 and 270. Here, because the first sub-pixel electrodes 191*a* receive the data voltages through the left data lines 171*l* and the second sub-pixel electrodes 191*b* receive the data voltages through the right data lines 171r, different voltages may be applied thereto. In this way, if the different voltages are applied, the arrangement of the liquid crystal of the corresponding regions becomes different. Accordingly, when the voltages applied to the first and second sub-pixel electrodes 191a and 191b are appropriately adjusted, it may be possible to make an image viewed from the side appear as similar as possible to an image viewed from the front. That is, it may be possible to improve the side visibility of the liquid crystal display. Here, the absolute value of the voltage applied to the first sub-pixel electrode 191a having a wider area among the first sub-pixel electrodes 191a and the second sub-pixel electrodes 191b should be higher than the absolute value of the voltage applied to the second sub-pixel electrodes 191b in order to improve the side visibility.

The first sub-pixel electrodes 191a have a plurality of cutouts, and the cutouts and a gap 94 between the first sub-pixel electrodes 191a and the second sub-pixel electrodes 191b generate horizontal components of the electric field along with cutouts of a common electrode (not shown) formed on a display panel (not shown) facing the thin film transistor array panel or protrusions (not shown) formed on the common electrode to control the arrangement operation of the liquid crystal.

The sub-pixel electrodes 191a and 191b and the common electrode form a capacitor (hereinafter referred to as "liquid crystal capacitor") to maintain the applied voltage even after the thin film transistor is turned off. To enhance the voltage storage capacity, a storage capacitor coupled to the liquid crystal capacitor in parallel is formed by overlapping the first and second sub-pixel electrodes 191a and 191b, and the storage electrode lines 131. Here, because the color filters 230 are not present between the storage electrodes 137 and the first and second sub-pixel electrodes 191a and 191b, the capacitance of the storage capacitor may be increased. If the capacitance of the storage capacitor is small, the second portions 223a and 223b of the light blocking member 220 may be omitted. In this case, the color filters 230 are disposed between the first and second sub-pixel electrodes 191a and 191b, and the storage electrode 137, which may the capacitance of the storage capacitor. A kick-back voltage may be increased due to the reduction of the storage capacitance, but this may be solved by decreasing the size of the thin film transistor to reduce the parasitic capacitance generated between the gate electrode and the drain electrode thereof, or by using a liquid crystal material having a large dielectric ratio to increase the liquid crystal capacitance.

A pair of first and second subpixel electrodes 191a and 191b forming one pixel electrode are engaged with each other with the gap 94 therebetween. The shape of the pixel electrodes 191 may vary.

Figure 6:
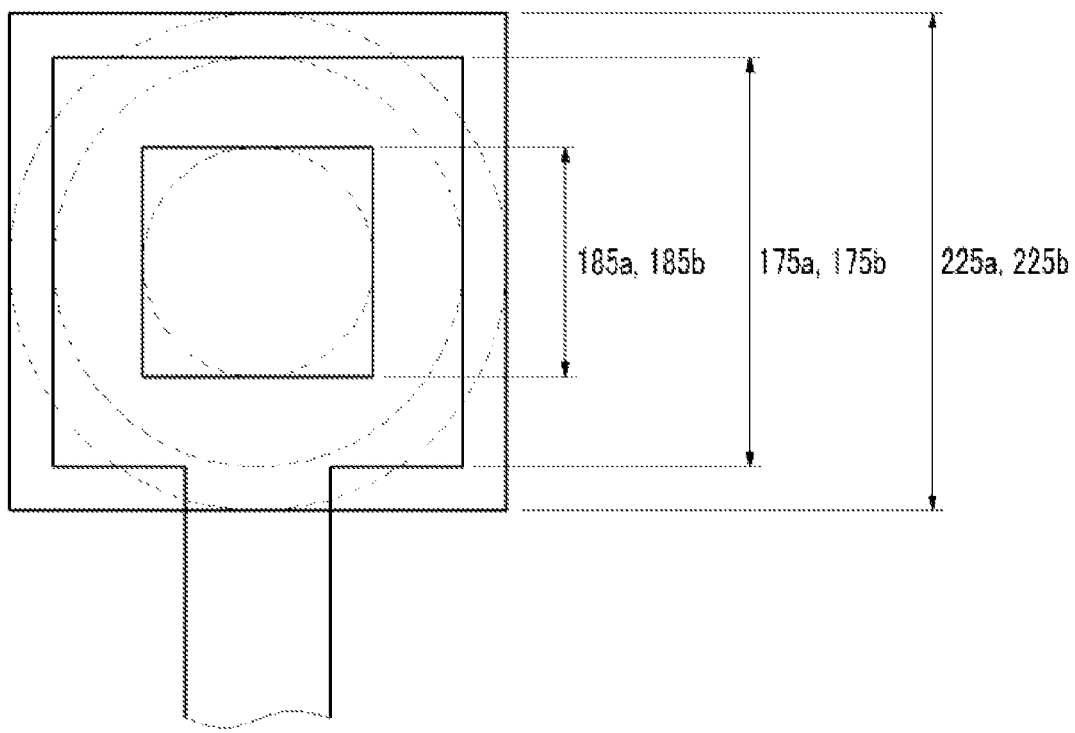
FIG. 6 is layout view enlarging the cross-sectional of one side of the drain electrode in the thin film transistor array panel according to an exemplary embodiment of the present invention.

Next, the width (or diameter) of the third portions 225a and 225b of the light blocking member and the width (or diameter) of the end portion of the drain electrode 175a and 175b will be described with reference to FIG. 6, in relation to the width (or diameter) of the removal regions of the light blocking member forming the contact holes 185a and 185b. Here, the diameter is applied to the case in which at least one of the third portions 225a and 225b of the light blocking member, the end portion of the drain electrode, and the removal region of the light blocking member is a circular shape, as indicated by the dotted line in FIG. 6.

As above-described, according to an exemplary embodiment of the present invention, the third portions 225a and 225b are formed on the circumference of the drain electrodes 175a and 175b such that the area of the drain electrodes 175a and 175b may be reduced, which may improve the aperture ratio. However, this effect may be gained without considering the error margin provided by considering the process capacity of the exposure device and the inclined surface of the color filter 230 formed due to the opening in the case in which the third portions 225a and 225b are not formed. When the third portions 225a and 225b are not formed, the interval between the contact hole and the opening of the color filter may be about 3um, and the interval from the opening of the color filter to the edge of the end portion of the drain electrode may be about 6 um. However, as in the exemplary embodiment of the present invention, the third portions 225a and 225b are formed on the drain electrodes 175a and 175b such that the drain electrodes 175a and 175b may be formed with almost the same or less area than that of the opening of the color filter 230. In an exemplary embodiment of the present invention, the width (or diameter) of the contact holes 185a and 185b may be in the range of 5-25 μm, the width (or diameter) of the drain electrodes 175a and 175b may be in the range of 5-35 μm, and the width (or diameter) of the third portions 225a and 225b may be in the range of 15-60 μm in consideration of the align error of the exposure device. Here, the third portions 225a and 225b of the light blocking member 220 are somewhat wider than the drain electrodes 175a and 175b such that it may be possible for the third portions 225a and 225b of the light blocking member 220 to cover the boundaries of the drain electrodes 175a and 175b.

Next, the manufacturing method of the thin film transistor array panel including these elements will be described in detail.

Figure 7:
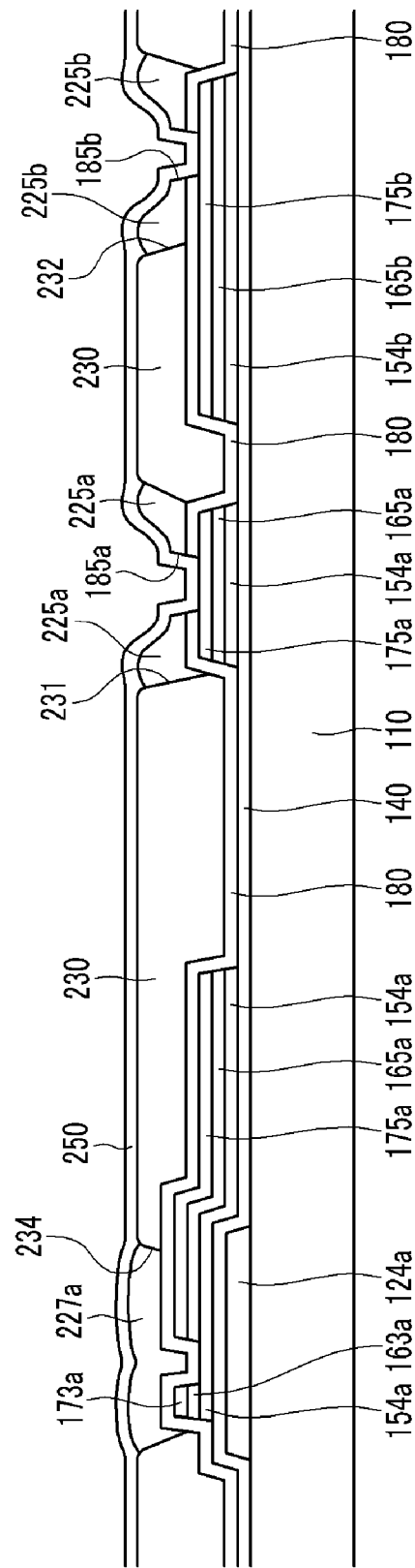
FIG. 7 and FIG. 8 are cross-sectional views showing intermediate steps in a manufacturing process of the thin film transistor array panel according to an exemplary embodiment of the present invention.
Figure 8:
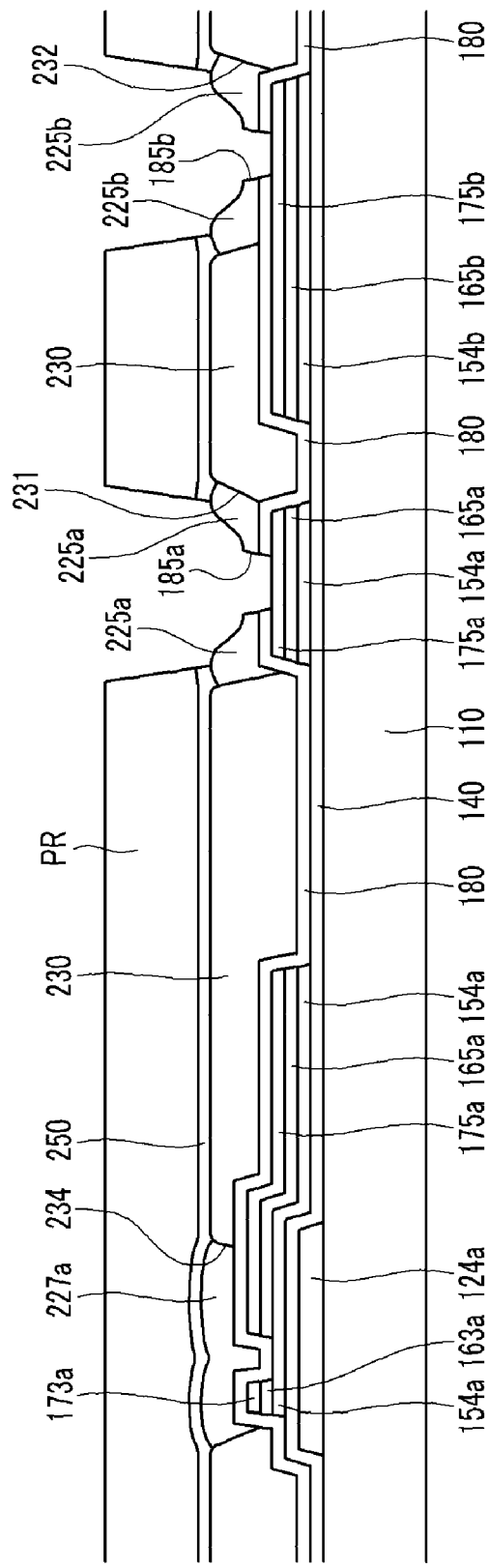

FIG. 7 and FIG. 8 are cross-sectional views showing the intermediate steps in the manufacturing process of the thin film transistor array panel according to an exemplary embodiment of the present invention.

Firstly, as shown in FIG. 1 and FIG. 7, a metal layer such as aluminum-neodymium (AlNd) or molybdenum (Mo) is deposited on an insulation substrate 110 and patterned by photolithography to form a gate line 121 including gate electrodes 124a and 124b and an end portion 129, a storage electrode line 131 including branches 133a and 133b, and a storage electrode 137.

Next, a gate insulating layer 140 is formed on the gate line 121 and the storage electrode line 131, a semiconductor layer, an ohmic contact layer, a data metal layer, and a photoresist film are sequentially deposited, and the photoresist film is patterned by a photo process using a half-tone mask to form a photoresist film pattern having different thicknesses in different regions. Here, in the photoresist film pattern, the thickness of a region corresponding to the portion where the data lines 171l and 171r and the drain electrodes 175a and 175b is thick, and the thickness of a region corresponding to a portion between the source electrodes 173a and 173b and the drain electrodes 175a and 175b is thin. Next, the data metal layer, the ohmic contact layer, and the semiconductor layer are etched by using the photoresist film pattern as an etch mask to form a preliminary data line, a preliminary ohmic contact, and a plurality of semiconductor stripes 151l and 151r (see FIG. 3), and the photoresist film pattern is ashed to remove a thin portion among the photoresist film pattern corresponding to the portion between the source electrodes 173a and 173b, and the drain electrodes 175a and 175b. The preliminary data line and the preliminary ohmic contact are then etched using the ashed photoresist film pattern as an etch mask to form a plurality of data lines 171l and 171r and a plurality of drain electrodes 175a and 175b, and a plurality of ohmic contacts 161l, 161r, 165a, and 165b thereunder.

Next, a passivation layer 180 is formed on the data lines 171l and 171r and the drain electrodes 175a and 175b.

Then, a photoresist including pigments is repeatedly coated, exposed, and developed to form color filters 230 including a plurality of openings 231, 232, 233, 234, and 235.

A photoresist including the dispersed black color pigments is then coated, exposed, and developed to form a light blocking member 220 including the first portion 221, the second portions 223a and 223b, the third portions 225a and 225b, and the fourth portions 227a and 227b in the openings 231, 232, 233, 234, and 235 of the color filters 230. When forming the light blocking member 220 made of an organic material without photosensitivity, the light blocking member 220 is patterned by photolithography.

An overcoat 250 is formed on the color filter 230 and the light blocking member 220.

Next, as shown in FIG. 8, a photoresist film pattern PR exposing the overcoat 250 on the third portions 225a and 225b of the light blocking member 220 is formed on the overcoat 250, and the overcoat 250 and the passivation layer 180 are sequentially patterned by photolithography to form contact holes 185a and 185b on a portion enclosing the third portions 225a and 225b. Here, the overcoat 250 on the third portions 225a and 225b is removed such that the overcoat 250 and the passivation layer 180 are prevented from contacting each other.

The first and second subpixel electrodes 191a and 191b, and the contact assistants 81, 82l, and 82r, are then formed on the overcoat 250 (see FIG. 1).

According to an exemplary embodiment of the present invention, the light blocking member encloses the contact holes such that the area where the liquid crystal cell gap on the circumference of the contact holes becomes non-uniform may be decreased, and the light blocking member prevents the light leakage generated at the circumference of the contact holes such that the area of the drain electrode may be decreased, which may improve the aperture ratio.

Also, according to an exemplary embodiment of the present invention, when the color filter on the storage electrode is removed to sufficiently form the storage capacitance, the light blocking member is formed on the circumference of the storage electrode such that the area where the liquid crystal cell gap becomes non-uniform may be decreased, and the light blocking member may prevent light leakage near the storage electrode such that the storage electrode has a narrow area, which may improve the aperture ratio.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
   a substrate;
   a gate line extending in a first direction on the substrate;
   a data line disposed on the substrate, the data line crossing and insulated from the gate line and extending in a second direction;
   a thin film transistor comprising a gate electrode connected to the gate line, a source electrode connected to the data line, and a drain electrode;
   a color filter disposed on the thin film transistor, the color filter comprising an opening corresponding to the drain electrode of the thin film transistor;
   a light blocking member, comprising a drain electrode light blocking portion disposed in the opening of the color filter, exposing a first region of a first end portion of the drain electrode of the thin film transistor and enclosing a circumference of the first region; and
   a pixel electrode disposed on the light blocking member and the color filter, the pixel electrode contacting the first region of the drain electrode.

2. The thin film transistor array panel of claim 1, further comprising an overcoat comprising an inorganic insulating material arranged between the color filter and the pixel electrode and between the light blocking member and the pixel electrode.

3. The thin film transistor array panel of claim 2, further comprising a passivation layer comprising an inorganic insulating material arranged between the color filter and the thin film transistor and between the light blocking member and the thin film transistor.

4. The thin film transistor array panel of claim 3, wherein the drain electrode light blocking portion covers a boundary of the first end portion of the drain electrode.

5. The thin film transistor array panel of claim 4, wherein a width or radius of the first region is in the range of 5-25 μm, a width or radius of the first end portion of the drain electrode is in the range of 5-35 μm, and a width or radius of the drain electrode light blocking portion is in the range of 15-60 μm.

6. The thin film transistor array panel of claim 5, wherein the light blocking member further comprises a signal line portion extending along the data line, and the color filter is divided into two regions by the signal line portion, the two regions having different colors from each other.

7. The thin film transistor array panel of claim 6, further comprising a storage electrode line extending in the first direction and comprising a storage electrode, wherein the light blocking member further comprises a storage electrode light blocking portion enclosing at least a portion of the storage electrode along with the signal line portion.

8. The thin film transistor array panel of claim 7, wherein the light blocking member further comprises a thin film transistor portion covering the thin film transistor.

9. The thin film transistor array panel of claim 1, wherein the drain electrode light blocking portion covers the boundary of the first end portion of the drain electrode.

10. The thin film transistor array panel of claim 9, wherein a width or radius of the first region is in the range of 5-25 μm, a width or radius of the first end portion of the drain electrode is in the range of 5-35 μm, and a width or radius of the drain electrode light blocking portion is in the range of 15-60 μm.

11. The thin film transistor array panel of claim 1, wherein the data line comprises a first data line and a second data line;
   the thin film transistor comprises a first thin film transistor having a first source electrode connected to the first data line and a second thin film transistor having a second source electrode connected to the second data line; and
   the pixel electrode comprises a first subpixel electrode connected to a first drain electrode of the first thin film transistor, and a second subpixel electrode connected to a second drain electrode of the second thin film transistor.

12. The thin film transistor array panel of claim 11, wherein the drain electrode light blocking portion of the light blocking member comprises a first drain electrode light blocking portion enclosing the first drain electrode of the first thin film transistor, and a second drain electrode light blocking portion enclosing the second drain electrode of the second thin film transistor.

* * * * *